United States Patent
Yao et al.

(10) Patent No.: US 12,526,944 B2
(45) Date of Patent: Jan. 13, 2026

(54) METHODS FOR FORMING ELECTRONIC DEVICE HOUSINGS

(71) Applicant: Meta Platforms Technologies, LLC, Menlo Park, CA (US)

(72) Inventors: Zhicong Yao, Bellevue, WA (US); Luke Murphy, Heath, TX (US); Robert Liang, Dublin, CA (US); Eric Santini, Redwood City, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 397 days.

(21) Appl. No.: 18/151,838

(22) Filed: Jan. 9, 2023

(65) Prior Publication Data
US 2023/0262913 A1    Aug. 17, 2023

Related U.S. Application Data

(60) Provisional application No. 63/310,887, filed on Feb. 16, 2022.

(51) Int. Cl.
*H05K 5/04* (2006.01)
*B21C 1/22* (2006.01)
*C21D 9/08* (2006.01)

(52) U.S. Cl.
CPC .............. *H05K 5/04* (2013.01); *C21D 9/08* (2013.01); *B21C 1/22* (2013.01)

(58) Field of Classification Search
CPC ... H05K 5/04; H05K 5/10; C21D 9/08; B21C 1/22; B21C 1/16
See application file for complete search history.

(56) References Cited

U.S. PATENT DOCUMENTS

| | | | |
|---|---|---|---|
| 7,688,574 B2 | 3/2010 | Zadesky et al. | |
| 7,894,185 B2 | 2/2011 | Weber et al. | |
| 9,423,218 B2 | 8/2016 | Hartl et al. | |
| 2004/0261918 A1 | 12/2004 | Ando et al. | |
| 2008/0165485 A1* | 7/2008 | Zadesky | H04M 1/0252 361/679.56 |
| 2009/0282952 A1 | 11/2009 | Yen | |

(Continued)

FOREIGN PATENT DOCUMENTS

| | | |
|---|---|---|
| CN | 101219513 A | 7/2008 |
| CN | 101627136 A | 1/2010 |

(Continued)

OTHER PUBLICATIONS

JP-2000205274-A English (Year: 2000).*

(Continued)

*Primary Examiner* — Ricardo D Morales
(74) *Attorney, Agent, or Firm* — McDermott Will & Schulte LLP

(57) ABSTRACT

Housings for electronic devices may include a steel body, such as a stainless steel body, that has an outer portion and an inner portion. The outer portion may exhibit an average Vickers hardness of 200 HV or higher. The inner portion may exhibit an average Vickers hardness of 180 HV or lower. The lower hardness of the inner portion may facilitate working the material of the inner portion, such as to form attachment points, protrusions, holes, or other features. Various additional devices, methods, and systems are also disclosed.

19 Claims, 8 Drawing Sheets

(56) References Cited

U.S. PATENT DOCUMENTS

2016/0070393 A1 3/2016 Sharma et al.
2021/0092856 A1 3/2021 Jou et al.

FOREIGN PATENT DOCUMENTS

CN         101983247 A     3/2011
JP          2000205274 A  *  7/2000  ............. F16C 33/56

OTHER PUBLICATIONS

Tradeindia., "Smart Watch Case by Metal Injection Molding," Aug. 24, 2017, 03 Pages, Retrieved from the Internet URL: https://www.tradeindia.com/products/smart-watch-case-by-metal-injection-molding-4352699.html.
Zcmim.com., "MIM Parts for Electronic," 2025, 03 Pages, Retrieved from the Internet URL: https://www.zcmim.com/mim-parts/electronic-mim-parts/.
Office Action mailed Jul. 9, 2025 for Chinese Application No. 202310152524.1, filed Feb. 16, 2023, 10 pages.

* cited by examiner

METHODS FOR FORMING ELECTRONIC DEVICE HOUSINGS

CROSS REFERENCE TO RELATED APPLICATION

This application claims the benefit of U.S. Provisional Application No. 63/310,887, filed 16 Feb. 2022, the disclosure of which is incorporated, in its entirety, by this reference.

BRIEF DESCRIPTION OF DRAWINGS

The accompanying drawings illustrate a number of example embodiments and are a part of the specification. Together with the following description, these drawings demonstrate and explain various principles of the present disclosure.

Figure 1A:
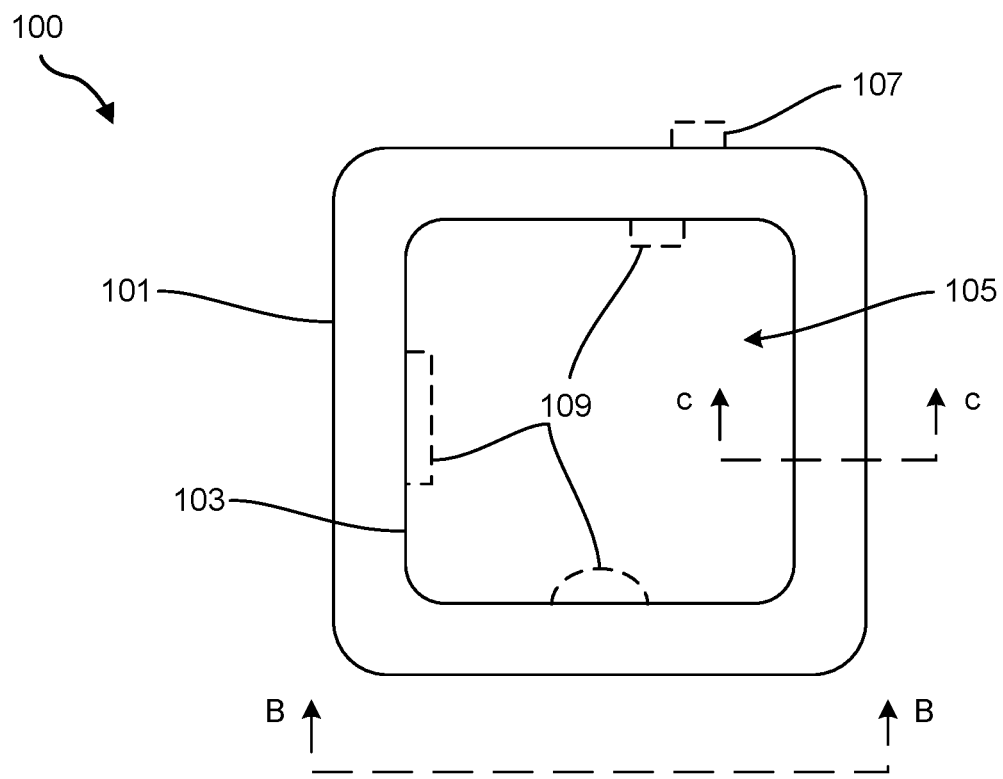
FIG. 1A is a plan view of a housing blank for the formation of a housing of an electronic device, according to at least one embodiment of the present disclosure.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the present disclosure covers all modifications, equivalents, and alternatives falling within this disclosure.

DETAILED DESCRIPTION OF EXAMPLE EMBODIMENTS

For electronic devices, such as watches, smart watches, fitness trackers, health monitors, smartphones, artificial-reality displays, etc., housings may be made with a stainless steel material (e.g., a 316 stainless steel, such as 316L stainless steel) to achieve a desired surface finish, corrosion resistance, and non-magnetic properties. The electronic device housings may be made with a series of alternating forging operations (e.g., cold forging operations) and annealing operations. Each of the forging operations may at least partially define some features and shapes of the housings. The forging operations may tend to harden the stainless steel material, making further cold working (e.g., additional forging steps, machining, etc.) difficult or impossible. The annealing operations may reduce a hardness of the stainless steel material to facilitate and/or enable such subsequent cold working. However, an increased hardness may improve an ability to obtain desirable outer surface properties of electronic device housings, such as a finish with a good appearance (e.g., a mirror finish) and a resistance to deformation and/or scratching.

The present disclosure is generally directed to methods of forming steel (e.g., stainless steel, such as a 316 stainless steel) parts, such as electronic device housings. For example, the present disclosure includes electronic devices, housings for electronic devices, and methods of forming housings for electronic devices. The methods of the present disclosure may include cold drawing a steel (e.g., stainless steel) material into a tube shape, cutting the tube shape into housing blanks, and heating an inner portion (e.g., a laterally inner portion) of the housing blanks to reduce a hardness of the inner portion while maintaining a lower temperature in an outer portion (e.g., a laterally outer portion) of the housing blanks. The softened inner portion may be machined to form at least one feature. In some examples, one or more features may be formed by forging (e.g., cold forging) at least a portion of the housing blanks.

The initial cold drawing of the steel material and/or forging may form a hardened exterior. The heat treatment of the inner portion may soften the material to facilitate machining. Maintaining the lower temperature of the outer portion may result in the outer portion having a higher hardness than the inner portion. For example, the outer portion of a resulting housing may have an average Vickers hardness of 200 HV or higher (e.g., 250 HV, 300 HV, 350 HV, 400 HV, etc.) while the inner portion may have an average Vickers hardness of 180 HV or lower (e.g., 170 HV, 150 HV, 130 HV, etc.). The harder outer portion may be capable of maintaining a good surface finish and resistance to deformation and scratching, while the lower hardness inner portion may include features for which formation is facilitated (e.g., by improving manufacturing speed, reducing tooling needs, reducing material waste, etc.).

Figure 1B:
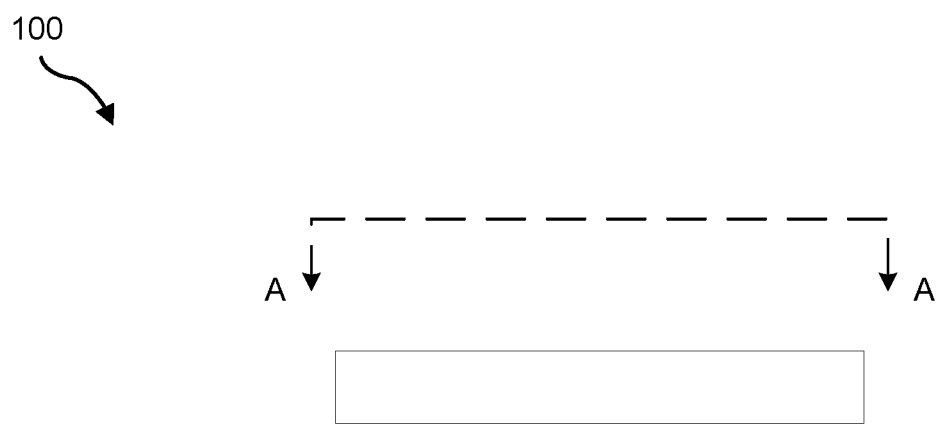
FIG. 1B is a side view of the housing blank of FIG. 1A. The view of FIG. 1B is taken from line B-B of FIG. 1A, and the view of FIG. 1A is taken from line A-A of FIG. 1B.

FIG. 1A is a plan view of a housing blank 100 for the formation of a housing of an electronic device, according to at least one embodiment of the present disclosure. FIG. 1B is a side view of the housing blank 100 of FIG. 1A. The view of FIG. 1B is taken from line B-B of FIG. 1A, and the view of FIG. 1A is taken from line A-A of FIG. 1B.

The housing blank 100 may be formed by cold drawing a stainless steel material (e.g., a 316 stainless steel material) into a tube shape including an outer portion 101 and an inner portion 103. The tube shape may then be cut to form the housing blank 100. The housing blank 100 may include a central aperture 105 defining a peripheral ring of the stainless steel material. Optionally, the cold drawing may be performed (e.g., with appropriate cold drawing dice) such that one or more outer protrusions 107 may extend outward from the outer portion 101. In some embodiments, the housing blank 100 may be cold drawn such that one or more inner protrusions 109 extend inward from the inner portion 103 into the central aperture 105. The housing blank 100 may have a near-net outer shape after the cold drawing and cutting operations are complete. In some examples, the cold drawing may cause a surface of the housing blank 100 to have an average Vickers hardness of about 200 HV or more.

Figure 2A:
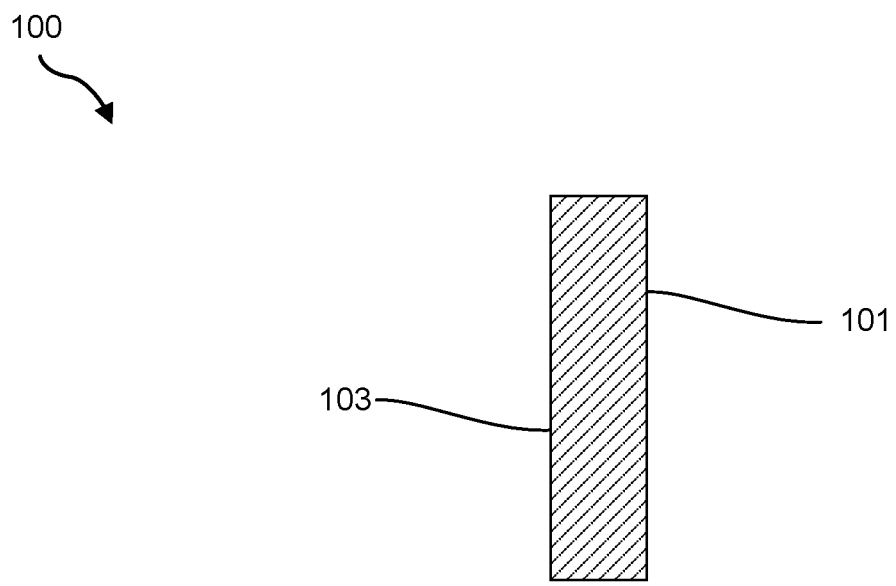
FIG. 2A is a cross-sectional view of the housing blank of FIGS. 1A and 1B, taken from line C-C of FIG. 1A.
Figure 2B:
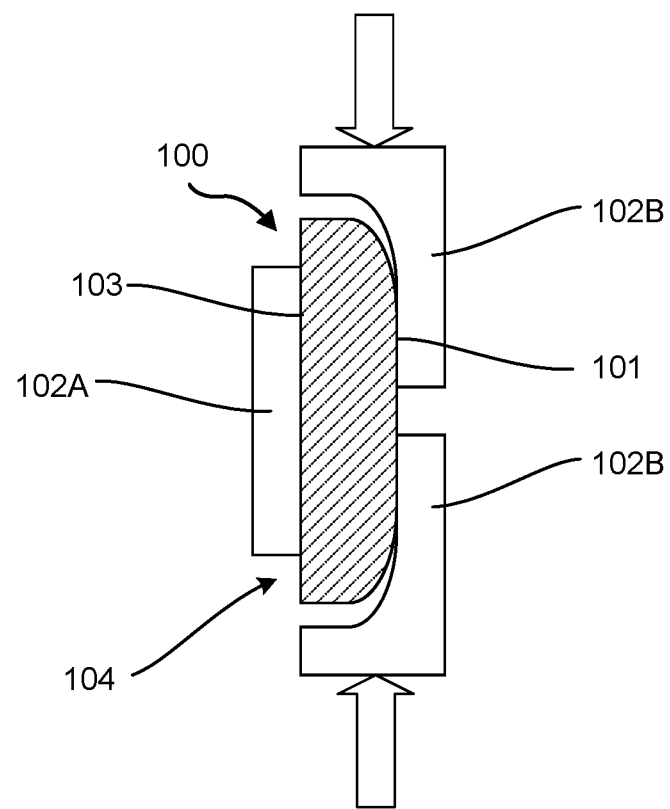
FIG. 2B illustrates a process of forging an outer portion of the housing blank to form at least one feature into the outer portion of the housing blank.

FIG. 2A is a cross-sectional view of the housing blank 100 of FIGS. 1A and 1B, taken from line C-C of FIG. 1A. FIG. 2B illustrates a process of forging an outer portion 101 of the housing blank 100 to form at least one feature (e.g., a rounded corner, curved surface, recess, extension, etc.) into the outer portion 101 of the housing blank 100.

As shown in FIG. 2A, after the housing blank 100 is formed by slicing the cold-drawn steel material from the tube shape, a section of the housing blank 100 as identified in FIG. 1A at line C-C may have a generally rectangular shape. In some examples, at least one feature may be formed in the outer portion 101 of the housing blank 100 by forging. The forging may result in the housing blank 100 having a desired shape and an increased hardness. In some embodiments, as initially cold-drawn and after slicing, the housing blank 100 may be formed to include additional material to account for the shape modification that will result from forging.

As shown in FIG. 2B, one or more forging tools 102 (e.g., forging hammer(s), forging anvil(s), forging die/dice, etc.) may be used to forge at least the outer portion 101 of the housing blank 100, such as to form a rounded profile (e.g., including one or more rounded corners, as illustrated in FIG. 2B) or other features. By way of example and not limitation, the inner portion 103 of the housing blank 100 may be positioned against an inner forging die 102A, and one or more outer forging hammers 102B may be used to deform the outer portion 101 of the housing blank 100. In some embodiments, an open space 104 may be left between the inner forging die 102A and the outer forging hammers 102B to allow excess material of the housing blank 100 to flow. This excess material may be removed (e.g., machined) later. The forging operation may increase a hardness of at least the outer portion 101 of the housing blank 100 through cold working of the steel material thereof. The increased hardness may be desirable to hold a high polish (e.g., a mirror polish, a surface roughness of 0.2 μm Ra roughness or less), to reduce scratching, and to reduce deformation (e.g., from a drop event).

Although FIG. 2A illustrates two outer forging hammers 102B, the present disclosure is not so limited. For example, in some embodiments a single outer forging hammer 102B may be used, or more than two outer forging hammers 102B may be used. In addition, a series of forging hammers 102B may be used, such as a rough forging hammer 102B to form the housing blank 100 into a rough shape and a final forging hammer 102B to form the housing blank 100 into a final, or near-final, shape.

The hardened material of the housing blank 100 (e.g., hardened by cold drawing and/or forging) may be difficult to machine. For example, machining a hardened stainless steel material may require expensive tooling that quickly wears out or breaks, frequently needing to be replaced and adding to manufacturing costs. Accordingly, portions of the housing blank 100 where machining is to take place (e.g., the inner portion of the housing blank 100) may be annealed (e.g., heated) to reduce a hardness thereof to facilitate machining. However, reducing a hardness of the outer portion 101 may be undesirable, since a stainless steel material of lower hardness may not hold as good a finish and may be more malleable and susceptible to scratching or other deformation.

Figure 3:
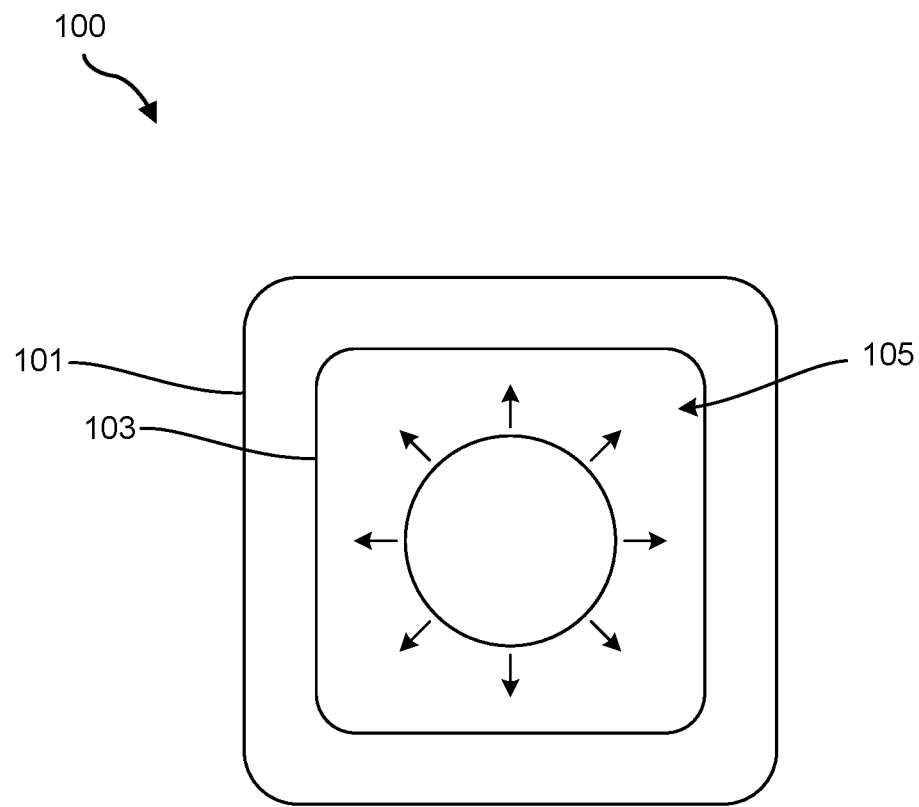
FIG. 3 illustrates a process of heating an inner portion of a housing blank, according to at least one embodiment of the present disclosure.

FIG. 3 illustrates a process of heating the inner portion 103 of the housing blank 100, according to at least one embodiment of the present disclosure. Features to be formed in the inner portion 103 of the housing blank 100 may be formed by machining. Such features may include, for example, a recess, a protrusion, a hole (e.g., a threaded hole), etc. The heating of the inner portion 103 may be performed to reduce a hardness of the inner portion 103 to facilitate machining or otherwise forming such features. The outer portion 101 of the housing blank 100 may be maintained at a lower temperature than the inner portion 103 to maintain or reduce a loss of the hardness thereof.

By way of example and not limitation, the inner portion 103 of the housing blank 100 may be annealed with a heating element (e.g., an induction heater, a heated rod, etc.) positioned in the central aperture 105 of the housing blank 100. The heat applied to the inner portion 103 may be sufficient to reduce the hardness thereof to facilitate machining, such as to an average Vickers hardness of 180 HV or lower, such as 170 HV, 150 HV, 140 HV, 130 HV, or lower. In some examples, the outer portion 101 of the housing blank 100 may be cooled during the inner heating process, such as with forced air, a cooling element, a liquid coolant, etc. The outer portion 101 of the housing blank 100 may maintain an average Vickers hardness of 200 HV or higher, such as 250 HV, 300 HV, 350 HV, 400 HV, or higher. In some embodiments, a difference between the average Vickers hardness of the outer portion and the average Vickers hardness of the inner portion may be at least 100 HV.

Figure 4:
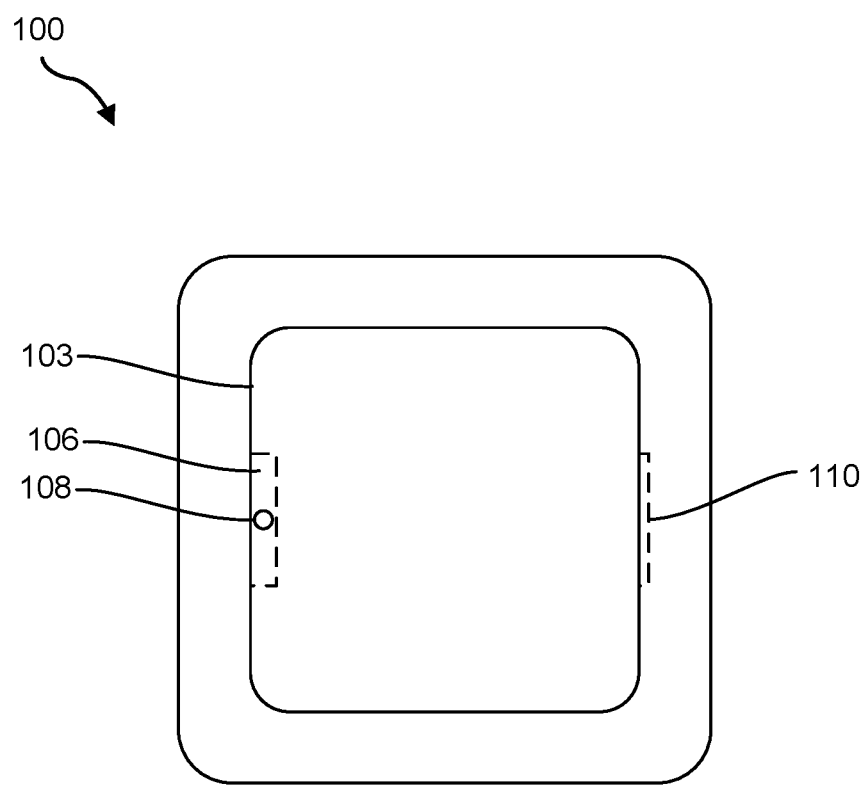
FIG. 4 illustrates a housing blank after machining at least one feature in the inner portion of the housing blank, according to at least one embodiment of the present disclosure.

FIG. 4 illustrates the housing blank 100 after machining at least one feature in the inner portion 103 of the housing blank 100, according to at least one embodiment of the present disclosure. By way of example and not limitation, the inner portion 103 of the housing blank 100 may be machined (e.g., cut, drilled, abraded, tapped, etc.) to form a protrusion 106, a hole 108 (e.g., a threaded hole), a recess 110, etc. The machining may be performed on portions of the stainless steel material that have been softened by the annealing process illustrated in FIG. 3, such as to a Vickers hardness of 180 HV or less.

Figure 5:
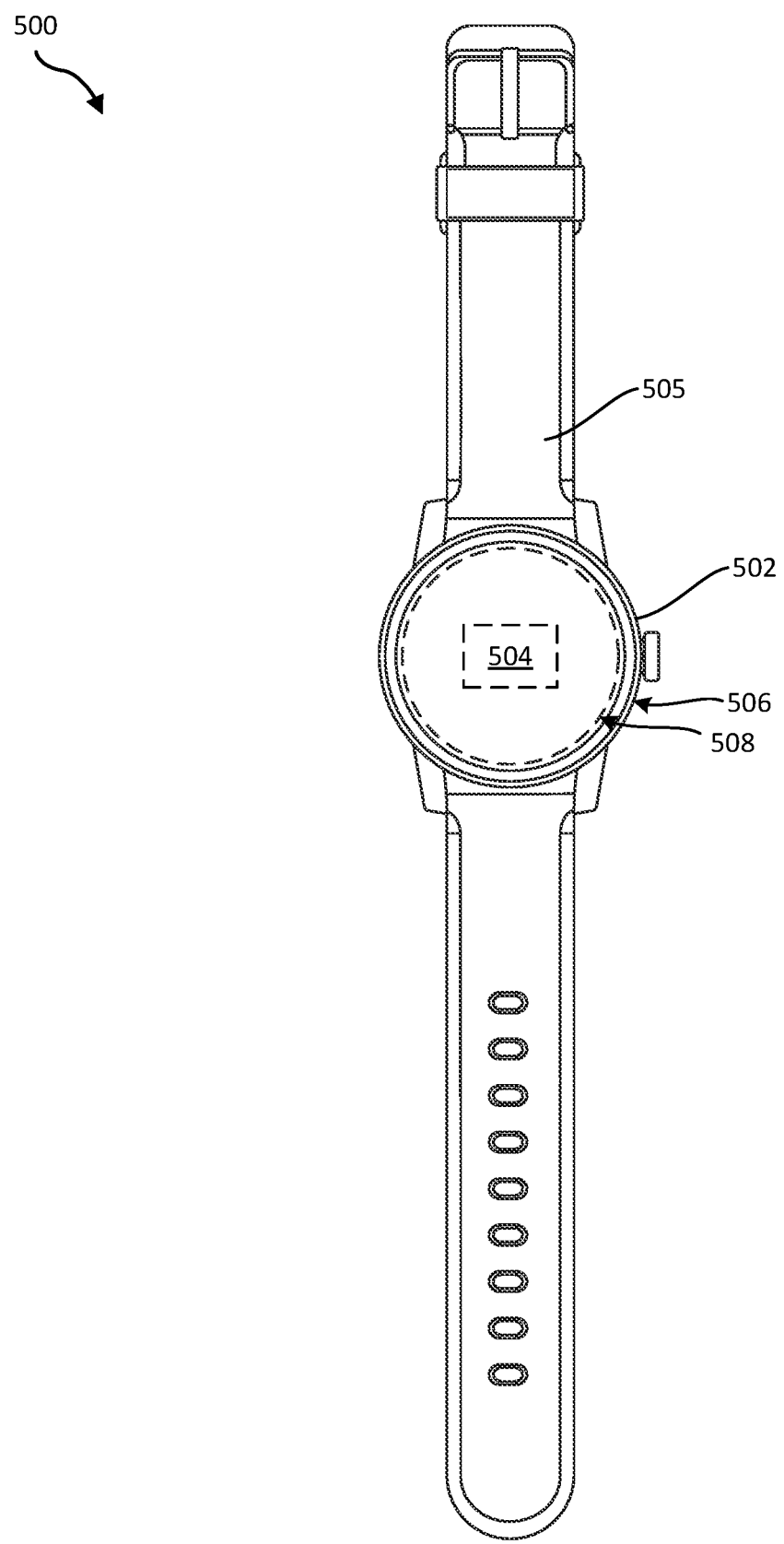
FIG. 5 is a plan view of an electronic device including a housing, according to at least one embodiment of the present disclosure.

FIG. 5 is a plan view of an electronic device 500 including a housing 502, according to at least one embodiment of the present disclosure. By way of example and not limitation, the electronic device 500 may be a wearable device, such as a wristwatch. The housing 502 may be shaped and sized to support electrical components 504 adjacent to a user's body. A strap 505 may be configured to secure the housing 502 and electrical components 504 in position adjacent to the user's body, such as on a user's wrist, arm, leg, head, torso, etc.

The housing 502 may include a stainless steel body formed from a housing blank by the processes described above with reference to FIGS. 1A-4. Thus, the housing 502 may include an outer portion 506 and an inner portion 508. The outer portion 506 may be visible and exposed to a surrounding environment. The inner portion 508 may be at an interior of the electronic device 500, and thus may not be visible or exposed to a surrounding environment. As explained above, the outer portion 506 may have an average Vickers hardness that is higher than an average Vickers hardness of the inner portion 508. For example, the outer portion 506 may have an average Vickers hardness of 200 HV or higher and the inner portion 508 may have an average Vickers hardness of 180 HV or lower. In some embodiments, a difference between the average Vickers hardnesses of the outer portion 506 and the inner portion 508 may be 100 HV or greater. The outer portion 506 may exhibit a surface roughness of 0.2 μm Ra roughness or less, such as to hold a high polish and to be resistant to scratching and denting.

The electrical components 504 may be or include any electrical components suitable for an electronic device (e.g., a wearable electronic device). For example, the electrical components 504 may include wristwatch components, a touchscreen, a display screen, an inertial measurement unit, at least one biometric sensor (e.g., a heart rate sensor, a blood oxygen sensor, a blood pressure sensor, a neuromuscular signal sensor, etc.), a thermometer, a GPS receiver, a wireless communication element, a battery, a processor, memory, fitness tracker components, or any combination thereof.

By way of example, wristwatch components may include components for a watch, such as timekeeping components, a display screen, a touchscreen, user input buttons and/or dials, etc. In some examples, wristwatch components may be components of a so-called "smartwatch."

Fitness tracker components may be components configured to track fitness-related activities or metrics of a user. For example, fitness tracker components may include one or more of a pedometer, a gyroscope, an accelerometer, an altimeter, a heart rate sensor, a sweat sensor, a blood oxygen level detector, a bioimpedance sensor, a compass, etc.

As noted above, the inner portion 508 of the housing 502 may include at least one machined feature. By way of example and not limitation, the at least one machined feature may be configured to secure and support the electrical components 504 and other components of the electronic device 500 to the housing 502 (e.g., at least partially within an interior of the housing 502).

Figure 6:
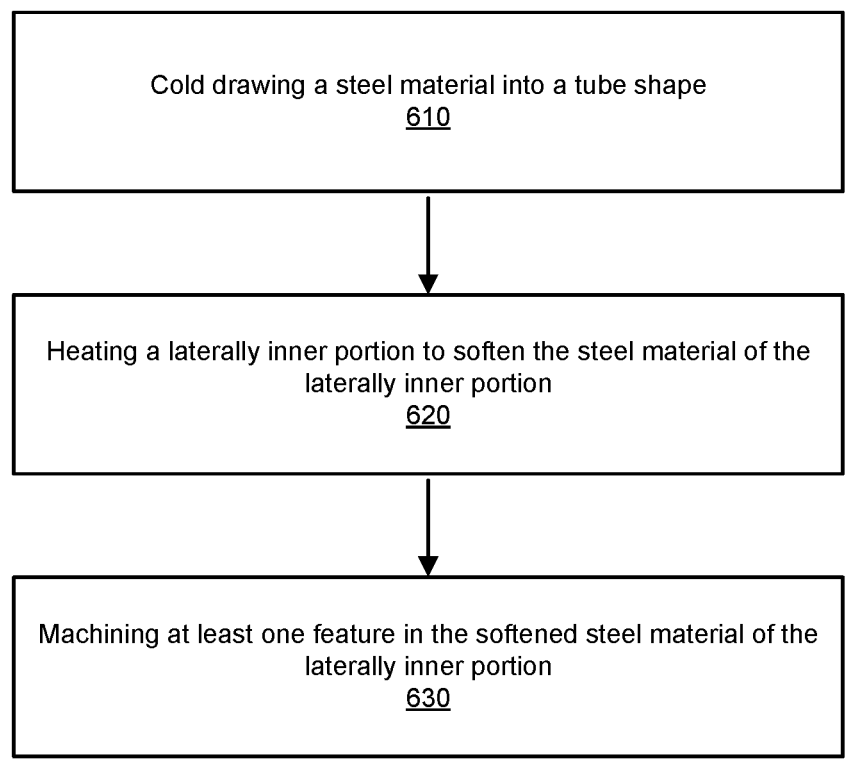
FIG. 6 is a flow diagram illustrating a method of forming a housing for an electronic device, according to at least one embodiment of the present disclosure.

FIG. 6 is a flow diagram illustrating a method 600 of forming a housing for an electronic device, according to at least one embodiment of the present disclosure. At operation 610, a steel material (e.g., a stainless steel material) may be cold drawn into a tube shape. Operation 610 may be performed in a variety of ways. For example, the cold drawing may be performed by drawing a billet and/or a flat sheet of steel material through one or more cold drawing dies. The tube shape may include an outer portion and an inner portion. The tube shape may have a variety of inner and outer shapes, such as circular or non-circular (e.g., rectangular, rounded rectangular, oval, etc.). The tube shape may be formed to have a variety of features, such as one or more inner protrusions, inner recesses, outer protrusions, outer recesses, curvatures, etc.

At operation 620, the inner portion may be heated (e.g., annealed, induction heated) to reduce a hardness of the steel material of the inner portion. Meanwhile, the outer portion may be maintained at a lower temperature than the inner portion. Operation 620 may be performed in a variety of ways. For example, while the inner portion is heated, the outer portion may be subject to cooling and/or ambient temperatures. Maintaining the lower temperature of the outer portion may cause the outer portion to exhibit a higher hardness, which may facilitate a better polish and better resistance to scratching and deformation.

At operation 630, at least one feature may be machined in the reduced hardness material of the inner portion. Operation 630 may be performed in a variety of ways. For example, the at least one feature may include a recess, a hole (e.g., a threaded hole), a protrusion, etc.

The method 600 may include additional operations. For example, prior to or after the heating of the inner portion, at least one forging operation may be performed on the outer portion to form at least one feature (e.g., strap clasp, button recess, rounded corner, profile feature, etc.) into the outer portion of the steel material. In addition, after cold drawing the steel material into the tube shape, the cold drawn steel material may be cut (e.g., laser cut, cut with a band saw, ablated, waterjet cut, etc.) into housing blanks that each include the outer portion and the inner portion.

Accordingly, the present disclosure includes electronic devices including improved housings, and methods for forming improved housings that exhibit a desirable high hardness on an outer portion thereof, and a relatively lower hardness on an inner portion thereof to facilitate manufacturing (e.g., machining).

Embodiments of the present disclosure relating to housings for electronic devices have been described above. However, the present disclosure is not so limited. For example, the methods of hardening an outer portion and softening an inner portion of a component may be employed for a variety of steel (e.g., stainless steel) devices and components that may benefit from a relatively hard outer portion and a relatively soft inner portion. For example, components formed by methods disclosed herein may include wearable device strap components, mobile device components (e.g., smartphone enclosures, etc.), personal computer components, writing implement components, electrical connectors, camera components, etc.

Housings of the present disclosure may be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 700 in FIG. 7) or that visually immerses a user in an artificial reality (such as, e.g., virtual-reality system 800 in FIG. 8). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 7:
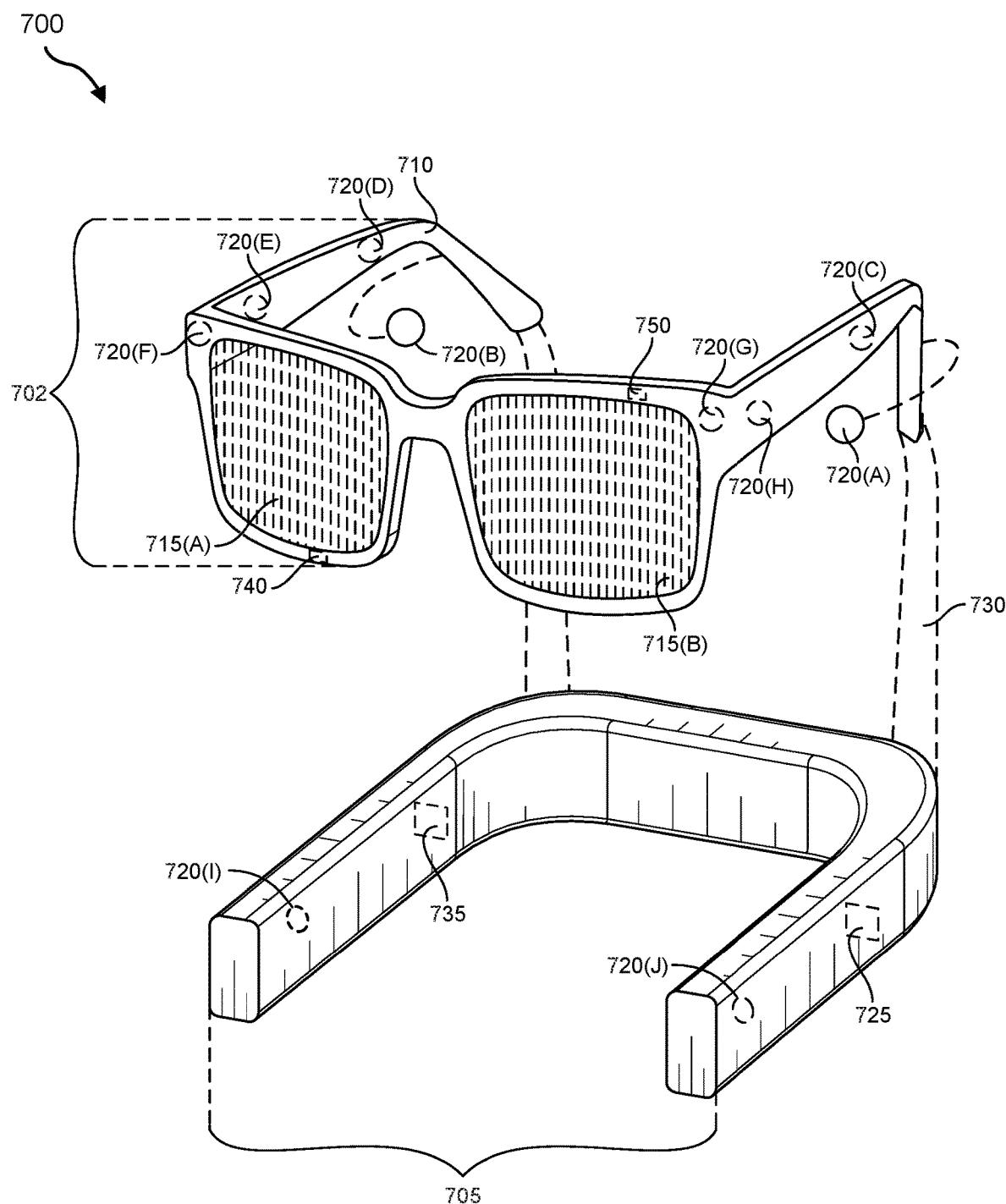
FIG. 7 is an illustration of example augmented-reality glasses that may be used in connection with embodiments of this disclosure.
Figure 8:
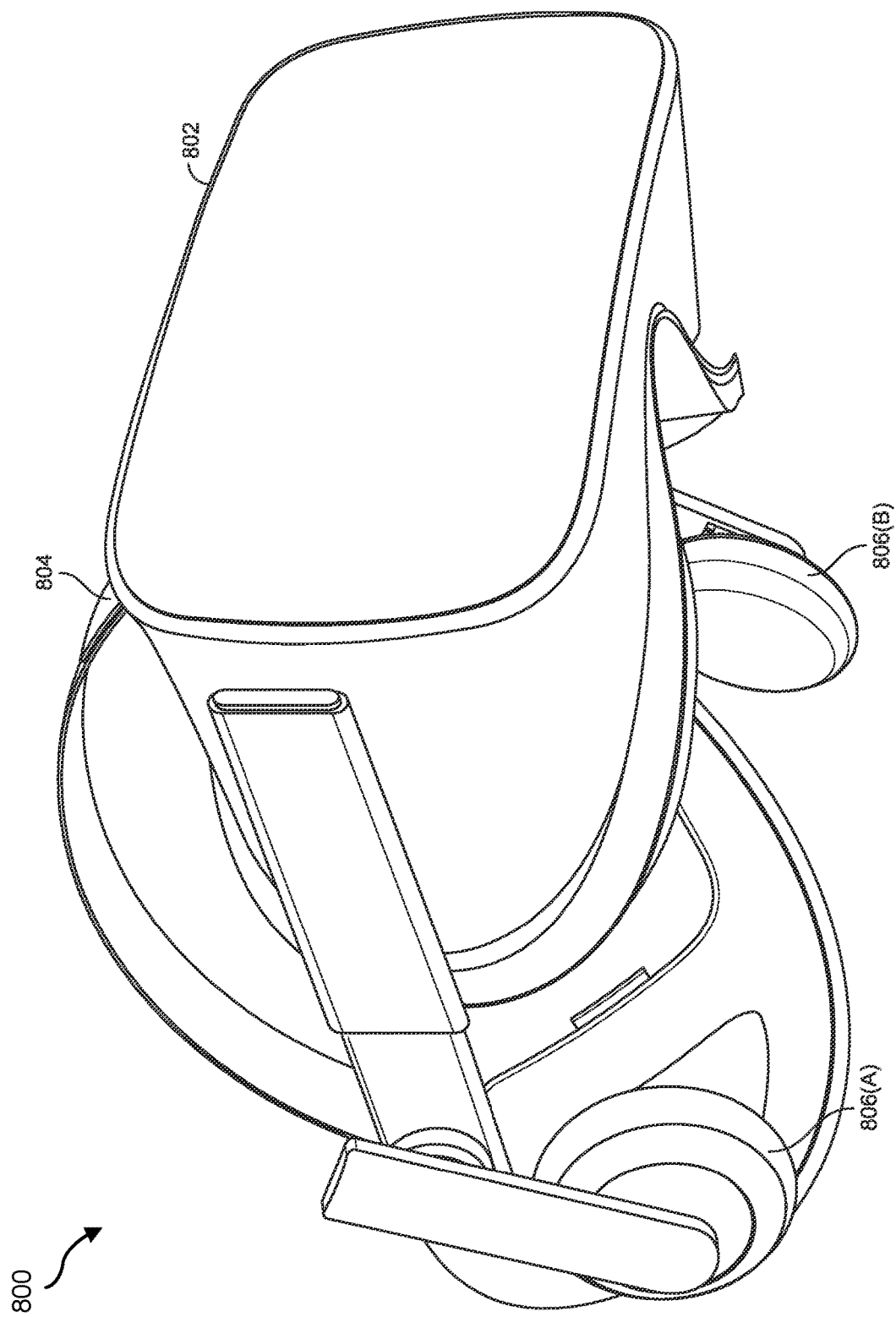
FIG. 8 is an illustration of an example virtual-reality headset that may be used in connection with embodiments of this disclosure.

Turning to FIG. 7, the augmented-reality system 700 may include an eyewear device 702 with a frame 710 configured to hold a left display device 715(A) and a right display device 715(B) in front of a user's eyes. The display devices 715(A) and 715(B) may act together or independently to present an image or series of images to a user. While the augmented-reality system 700 includes two displays, embodiments of this disclosure may be implemented in augmented-reality systems with a single NED or more than two NEDs.

In some embodiments, the augmented-reality system 700 may include one or more sensors, such as sensor 740. The sensor 740 may generate measurement signals in response to motion of the augmented-reality system 700 and may be located on substantially any portion of the frame 710. The sensor 740 may represent one or more of a variety of different sensing mechanisms, such as a position sensor, an inertial measurement unit (IMU), a depth camera assembly, a structured light emitter and/or detector, or any combination thereof. In some embodiments, the augmented-reality system 700 may or may not include the sensor 740 or may include more than one sensor. In embodiments in which the sensor 740 includes an IMU, the IMU may generate calibration data based on measurement signals from the sensor 740. Examples of the sensor 740 may include, without limitation, accelerometers, gyroscopes, magnetometers, other suitable types of sensors that detect motion, sensors used for error correction of the IMU, or some combination thereof.

In some examples, the augmented-reality system 700 may also include a microphone array with a plurality of acoustic transducers 720(A)-720(J), referred to collectively as acoustic transducers 720. The acoustic transducers 720 may represent transducers that detect air pressure variations induced by sound waves. Each acoustic transducer 720 may be configured to detect sound and convert the detected sound into an electronic format (e.g., an analog or digital format). The microphone array in FIG. 7 may include, for example, ten acoustic transducers: 720(A) and 720(B), which may be designed to be placed inside a corresponding ear of the user, acoustic transducers 720(C), 720(D), 720(E), 720(F), 720(G), and 720(H), which may be positioned at various locations on the frame 710, and/or acoustic transducers 720(1) and 720(J), which may be positioned on a corresponding neckband 705.

In some embodiments, one or more of the acoustic transducers 720(A)-(J) may be used as output transducers (e.g., speakers). For example, the acoustic transducers 720(A) and/or 720(B) may be earbuds or any other suitable type of headphone or speaker.

The configuration of the acoustic transducers 720 of the microphone array may vary. While the augmented-reality system 700 is shown in FIG. 7 as having ten acoustic transducers 720, the number of acoustic transducers 720 may be greater or less than ten. In some embodiments, using higher numbers of the acoustic transducers 720 may increase the amount of audio information collected and/or the sensitivity and accuracy of the audio information. In contrast, using a lower number of the acoustic transducers 720 may decrease the computing power required by an associated controller 750 to process the collected audio information. In addition, the position of each acoustic transducer 720 of the microphone array may vary. For example, the position of an acoustic transducer 720 may include a defined position on the user, a defined coordinate on the frame 710, an orientation associated with each acoustic transducer 720, or some combination thereof.

The acoustic transducers 720(A) and 720(B) may be positioned on different parts of the user's ear, such as behind the pinna, behind the tragus, and/or within the auricle or fossa. Or, there may be additional acoustic transducers 720 on or surrounding the ear in addition to the acoustic transducers 720 inside the ear canal. Having an acoustic transducer 720 positioned next to an ear canal of a user may enable the microphone array to collect information on how sounds arrive at the ear canal. By positioning at least two of the acoustic transducers 720 on either side of a user's head (e.g., as binaural microphones), the augmented-reality system 700 may simulate binaural hearing and capture a 3D stereo sound field around about a user's head. In some embodiments, the acoustic transducers 720(A) and 720(B) may be connected to the augmented-reality system 700 via a wired connection 730, and in other embodiments the acoustic transducers 720(A) and 720(B) may be connected to the augmented-reality system 700 via a wireless connection (e.g., a BLUETOOTH connection). In still other embodiments, the acoustic transducers 720(A) and 720(B) may not be used at all in conjunction with the augmented-reality system 700.

The acoustic transducers 720 on the frame 710 may be positioned in a variety of different ways, including along the length of the temples, across the bridge, above or below the display devices 715(A) and 715(B), or some combination thereof. The acoustic transducers 720 may also be oriented such that the microphone array is able to detect sounds in a wide range of directions surrounding the user wearing the augmented-reality system 700. In some embodiments, an optimization process may be performed during manufacturing of the augmented-reality system 700 to determine relative positioning of each acoustic transducer 720 in the microphone array.

In some examples, the augmented-reality system 700 may include or be connected to an external device (e.g., a paired device), such as the neckband 705. The neckband 705 generally represents any type or form of paired device. Thus, the following discussion of the neckband 705 may also apply to various other paired devices, such as charging cases, smart watches, smart phones, wrist bands, other wearable devices, hand-held controllers, tablet computers, laptop computers, other external compute devices, etc.

As shown, the neckband 705 may be coupled to the eyewear device 702 via one or more connectors. The connectors may be wired or wireless and may include electrical and/or non-electrical (e.g., structural) components. In some cases, the eyewear device 702 and the neckband 705 may operate independently without any wired or wireless connection between them. While FIG. 7 illustrates the components of the eyewear device 702 and neckband 705 in example locations on the eyewear device 702 and neckband 705, the components may be located elsewhere and/or distributed differently on the eyewear device 702 and/or neckband 705. In some embodiments, the components of the eyewear device 702 and neckband 705 may be located on one or more additional peripheral devices paired with the eyewear device 702, the neckband 705, or some combination thereof.

Pairing external devices, such as the neckband 705, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 700 may be provided by a paired device or shared between a paired device and an eyewear device, thus reducing the weight, heat profile, and form factor of the eyewear device overall while still retaining desired functionality. For example, the neckband 705 may allow components that would otherwise be included on an eyewear device to be included in the neckband 705 since users may tolerate a heavier weight load on their shoulders than they would tolerate on their heads. The neckband 705 may also have a larger surface area over which to diffuse and disperse heat to the ambient environment. Thus, the neckband 705 may allow for greater battery and computation capacity than might otherwise have been possible on a standalone eyewear device. Since weight carried in the neckband 705 may be less invasive to a user than weight carried in the eyewear device 702, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

The neckband 705 may be communicatively coupled with the eyewear device 702 and/or to other devices. These other devices may provide certain functions (e.g., tracking, localizing, depth mapping, processing, storage, etc.) to the augmented-reality system 700. In the embodiment of FIG. 7, the neckband 705 may include two acoustic transducers (e.g., 720(1) and 720(J)) that are part of the microphone array (or potentially form their own microphone subarray). The neckband 705 may also include a controller 725 and a power source 735.

The acoustic transducers 720(1) and 720(J) of the neckband 705 may be configured to detect sound and convert the detected sound into an electronic format (analog or digital). In the embodiment of FIG. 7, the acoustic transducers 720(1) and 720(J) may be positioned on the neckband 705, thereby increasing the distance between the neckband acoustic transducers 720(1) and 720(J) and the other acoustic transducers 720 positioned on the eyewear device 702. In some cases, increasing the distance between the acoustic transducers 720 of the microphone array may improve the accuracy of beamforming performed via the microphone array. For example, if a sound is detected by the acoustic transducers 720(C) and 720(D) and the distance between the acoustic transducers 720(C) and 720(D) is greater than, e.g., the distance between the acoustic transducers 720(D) and 720(E), the determined source location of the detected sound may be more accurate than if the sound had been detected by the acoustic transducers 720(D) and 720(E).

The controller 725 of the neckband 705 may process information generated by the sensors on the neckband 705 and/or augmented-reality system 700. For example, the controller 725 may process information from the microphone array that describes sounds detected by the microphone array. For each detected sound, the controller 725 may perform a direction-of-arrival (DOA) estimation to estimate a direction from which the detected sound arrived at the microphone array. As the microphone array detects sounds, the controller 725 may populate an audio data set with the information. In embodiments in which the augmented-reality system 700 includes an inertial measurement unit, the controller 725 may compute all inertial and spatial calculations from the IMU located on the eyewear device 702. A connector may convey information between the augmented-reality system 700 and the neckband 705 and between the augmented-reality system 700 and the controller 725. The information may be in the form of optical data, electrical data, wireless data, or any other transmittable data form. Moving the processing of information generated by the augmented-reality system 700 to the neckband 705 may reduce weight and heat in the eyewear device 702, making it more comfortable to the user.

The power source 735 in the neckband 705 may provide power to the eyewear device 702 and/or to the neckband 705. The power source 735 may include, without limitation, lithium ion batteries, lithium-polymer batteries, primary lithium batteries, alkaline batteries, or any other form of power storage. In some cases, the power source 735 may be a wired power source. Including the power source 735 on the neckband 705 instead of on the eyewear device 702 may help better distribute the weight and heat generated by the power source 735.

As noted, some artificial-reality systems may, instead of blending an artificial reality with actual reality, substantially replace one or more of a user's sensory perceptions of the real world with a virtual experience. One example of this type of system is a head-worn display system, such as the virtual-reality system 800 in FIG. 8, that mostly or completely covers a user's field of view. The virtual-reality system 800 may include a front rigid body 802 and a band 804 shaped to fit around a user's head. The virtual-reality system 800 may also include output audio transducers 806(A) and 806(B). Furthermore, while not shown in FIG. 8, the front rigid body 802 may include one or more electronic elements, including one or more electronic displays, one or more inertial measurement units (IMUS), one or more tracking emitters or detectors, and/or any other suitable device or system for creating an artificial-reality experience.

Artificial-reality systems may include a variety of types of visual feedback mechanisms. For example, display devices in the augmented-reality system 700 and/or virtual-reality system 800 may include one or more liquid crystal displays (LCDs), light emitting diode (LED) displays, microLED displays, organic LED (OLED) displays, digital light project (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in the augmented-reality system 700 and/or virtual-reality system 800 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, the augmented-reality system 700 and/or virtual-reality system 800 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

Any of the components of the systems 700, 800 described above may include one or more steel (e.g., stainless steel) housings formed by the processes described herein.

The following example embodiments are also included in the present disclosure.

Example 1: A housing for an electronic device, which may include: a steel body including an outer portion and an inner portion, wherein: the outer portion exhibits an average Vickers hardness of 200 HV or higher; and the inner portion exhibits an average Vickers hardness of 180 HV or lower.

Example 2: The housing of Example 1, wherein the outer portion exhibits an average Vickers hardness of 250 HV or higher and the inner portion exhibits an average Vickers hardness of 170 HV or lower.

Example 3: The housing of Example 1 or Example 2, wherein a difference between the average Vickers hardness of the outer portion and the average Vickers hardness of the inner portion is at least 100 HV.

Example 4: The housing of any of Examples 1 through 3, wherein the steel body includes a stainless steel body.

Example 5: The housing of Example 4, wherein the stainless steel body includes a 316 stainless steel material.

Example 6: The housing of any of Examples 1 through 5, wherein the outer portion exhibits a surface roughness of 0.2 µm Ra roughness or less.

Example 7: The housing of any of Examples 1 through 6, wherein the housing further includes at least one inner protrusion extending inward from a peripheral ring of the housing.

Example 8: The housing of any of Examples 1 through 7, further including at least one electrical component within the housing, wherein the electrical component includes at least one biometric sensor configured to sense at least one biometric of the user.

Example 9: The housing of Example 8, wherein the at least one biometric sensor includes at least one of: a heart rate sensor; a blood oxygen sensor; a blood pressure sensor; or a neuromuscular signal sensor.

Example 10: The housing of any of Examples 1 through 9, further including at least one electrical component within the housing, wherein the electrical component includes a wristwatch component.

Example 11: The housing of any of Examples 1 through 10, further including at least one electrical component within the housing, wherein the electrical component includes fitness tracker components.

Example 12: The housing of any of Examples 1 through 11, wherein the inner portion of the steel body includes at least one machined feature.

Example 13: The housing of Example 12, wherein the at least one machined feature includes at least one of: a recess; a protrusion; or a hole.

Example 14: The housing of any of Examples 1 through 13, wherein a difference between the average Vickers hardness of the outer portion and the average Vickers hardness of the inner portion results from applying heat to the inner portion while maintaining the outer portion at a lower temperature than the inner portion.

Example 15: A method of forming a housing for an electronic device, which method may include: heating an inner portion of a cold-drawn steel material to reduce a hardness of the steel material of the inner portion while maintaining an outer portion of the cold-drawn steel material at a lower temperature than the inner portion, such that the outer portion exhibits a higher hardness than the inner portion; and, after the heating, machining at least one feature in the inner portion of the cold-drawn steel material.

Example 16: The method of Example 15, further including polishing a surface of the outer portion to a surface roughness of 0.2 µm Ra or less.

Example 17: The method of Example 15 or Example 16, further including forging at least one feature into the outer portion of the cold-drawn steel material.

Example 18: The method of Example 17, wherein forging the at least one feature into the outer portion of the cold-drawn steel material includes causing at least a portion of the outer portion to have a rounded profile.

Example 19: The method of any of Examples 15 through 18, further including, prior to the heating, cutting the cold-drawn steel material into housing blanks.

Example 20: The method of any of Examples 15 through 19, wherein the cold-drawn steel material has a tube shape.

Example 21: The method of Example 20, further including cold drawing the steel material into the tube shape.

Example 22: The method of Example 21, wherein cold drawing the steel material into the tube shape includes cold drawing a stainless steel material into the tube shape.

Example 23: The method of any of Examples 15 through 22, wherein the cold-drawn steel material has a non-circular tube shape.

Example 24: The method of Example 15, wherein heating the inner portion includes induction heating the inner portion.

Example 25: An electronic device, which may include: a housing, including a stainless steel body including a radially outer portion and a radially inner portion, wherein: the radially outer portion exhibits an average Vickers hardness of 200 HV or higher and the radially inner portion exhibits an average Vickers hardness of 180 HV or lower, a difference between the average Vickers hardness of the radially outer portion and the average Vickers hardness of the radially inner portion is at least 100 HV, and the radially inner portion includes at least one machined feature; and at least one electronic component within the housing.

Example 26: The electronic device of Example 25, wherein the at least one electronic component includes at least one of: a biometric sensor; a wristwatch component; or a fitness tracker component.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The preceding description has been provided to enable others skilled in the art to best utilize various aspects of the example embodiments disclosed herein. This example description is not intended to be exhaustive or to be limited to any precise form disclosed. Many modifications, combinations, and variations are possible without departing from the spirit and scope of the present disclosure. The embodiments disclosed herein should be considered in all respects illustrative and not restrictive. Reference should be made to any claims appended hereto and their equivalents in determining the scope of the present disclosure.

Unless otherwise noted, the terms "connected to" and "coupled to" (and their derivatives), as used in the specification and/or claims, are to be construed as permitting both direct and indirect (i.e., via other elements or components) connection. In addition, the terms "a" or "an," as used in the specification and/or claims, are to be construed as meaning "at least one of." Finally, for ease of use, the terms "including" and "having" (and their derivatives), as used in the specification and/or claims, are interchangeable with and have the same meaning as the word "comprising."

What is claimed is:

1. A housing for an electronic device, comprising:
    a steel body including an outer portion and an inner portion, wherein
        the outer portion exhibits an average Vickers hardness of 200 HV or higher and
        the inner portion exhibits an average Vickers hardness of 180 HV or lower; and
    at least one biometric sensor configured to sense at least one biometric of a user.

2. The housing of claim 1, wherein the outer portion exhibits an average Vickers hardness of 250 HV or higher and the inner portion exhibits an average Vickers hardness of 170 HV or lower.

3. The housing of claim 1, wherein a difference between the average Vickers hardness of the outer portion and the average Vickers hardness of the inner portion is at least 100 HV.

4. The housing of claim 1, wherein the steel body comprises a stainless steel body.

5. The housing of claim 4, wherein the stainless steel body comprises a 316 stainless steel material.

6. The housing of claim 1, wherein the outer portion exhibits a surface roughness of 0.2 μm Ra roughness or less.

7. The housing of claim 1, wherein the housing further comprises at least one inner protrusion extending inward from a peripheral ring of the housing.

8. The housing of claim 1, wherein the at least one biometric sensor comprises at least one of:
    a heart rate sensor;
    a blood oxygen sensor;
    a blood pressure sensor; or
    a neuromuscular signal sensor.

9. The housing of claim 1, further comprising at least one electrical component within the housing, wherein the electrical component comprises a wristwatch component.

10. The housing of claim 1, further comprising at least one electrical component within the housing, wherein the electrical component includes fitness tracker components.

11. The housing of claim 1, wherein the inner portion of the steel body comprises at least one machined feature.

12. The housing of claim 11, wherein the at least one machined feature comprises at least one of:
    a recess;
    a protrusion; or
    a hole.

13. An electronic device, comprising:
    a housing, comprising a stainless steel body including a radially outer portion and a radially inner portion, wherein: the radially outer portion exhibits an average Vickers hardness of 200 HV or higher and the radially inner portion exhibits an average Vickers hardness of 180 HV or lower, a difference between the average Vickers hardness of the radially outer portion and the average Vickers hardness of the radially inner portion is at least 100 HV, and the radially inner portion comprises at least one machined feature; and
    the housing further comprises at least one biometric sensor configured to sense at least one biometric of a user.

14. The electronic device of claim 13, wherein the housing further comprises at least one of:
    a wristwatch component; or
    a fitness tracker component.

15. A method of forming a housing for an electronic device, the method comprising:
- heating an inner portion of a cold-drawn steel material to reduce a hardness of the steel material of the inner portion while maintaining an outer portion of the cold-drawn steel material at a lower temperature than the inner portion, such that the outer portion exhibits a higher hardness than the inner portion; and
- after the heating, machining at least one feature in the inner portion of the cold-drawn steel material.

16. The method of claim 15, further comprising polishing a surface of the outer portion to a surface roughness of 0.2 µm Ra or less.

17. The method of claim 15, further comprising forging at least one feature into the outer portion of the cold-drawn steel material.

18. The method of claim 17, wherein forging the at least one feature into the outer portion of the cold-drawn steel material comprises causing at least a portion of the outer portion to have a rounded profile.

19. The method of claim 15, wherein the cold-drawn steel material has a tube shape.

\* \* \* \* \*